United States Patent
Zverev et al.

(10) Patent No.: US 6,781,233 B2
(45) Date of Patent: Aug. 24, 2004

(54) SEMICONDUCTOR DEVICE AND CONVERTER DEVICE WITH AN INTEGRATED CAPACITOR

(75) Inventors: Ilia Zverev, München (DE); Marco Pürschel, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/230,008

(22) Filed: Aug. 28, 2002

(65) Prior Publication Data

US 2003/0042592 A1 Mar. 6, 2003

(30) Foreign Application Priority Data

Aug. 28, 2001 (DE) .......................................... 101 41 877

(51) Int. Cl.[7] .......................... H01L 23/34; H01L 27/108
(52) U.S. Cl. ...................... 257/723; 257/303; 257/306; 257/724
(58) Field of Search ................................. 257/296, 306, 257/307, 308, 906, 907, 908, 303, 516, 532, 777, 723, 689, 780, 782, 692, 693, 698, 724, 725

(56) References Cited

U.S. PATENT DOCUMENTS

| | | | | |
|---|---|---|---|---|
| 4,994,936 A | * | 2/1991 | Hernandez |
| 5,475,262 A | * | 12/1995 | Wang et al. |
| 5,528,083 A | * | 6/1996 | Malladi et al. |
| 5,872,403 A | * | 2/1999 | Bowman et al. |

FOREIGN PATENT DOCUMENTS

DE 198 57 043 C1 3/2000

* cited by examiner

*Primary Examiner*—Wael Fahmy
*Assistant Examiner*—Dilinh Nguyen
(74) *Attorney, Agent, or Firm*—Laurence A. Greenberg; Werner H. Stemer; Gregory L. Mayback

(57) ABSTRACT

In order to keep the mounting outlay for shielding measures as low as possible, a semiconductor device having a semiconductor component in a housing element is proposed. At least one capacitive element having a first electrode, a second electrode and a dielectric is provided in an integrated manner in the housing element or in the region thereof. The electrode regions of the capacitive element are electrically contact-connected to terminal regions of the semiconductor component, in such a way that high-frequency interference signals between terminal regions can be suppressed.

30 Claims, 4 Drawing Sheets

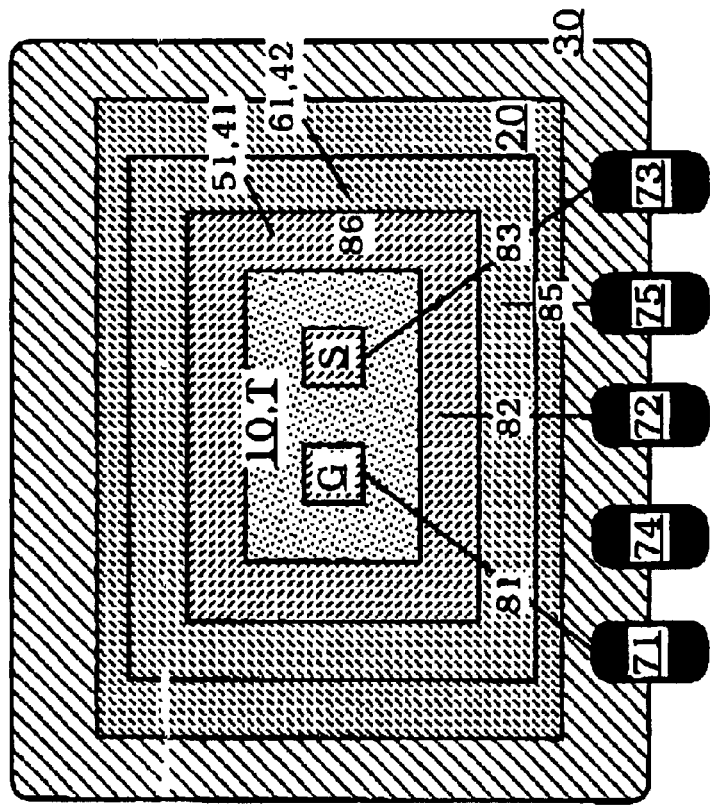
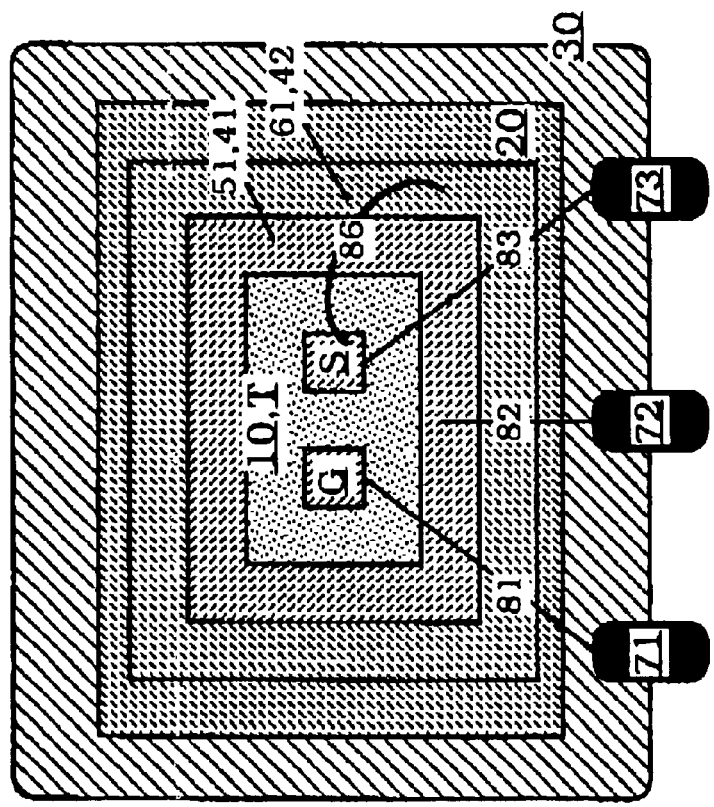

SEMICONDUCTOR DEVICE AND CONVERTER DEVICE WITH AN INTEGRATED CAPACITOR

BACKGROUND OF THE INVENTION

Field of the Invention

The invention relates to a semiconductor device and to a converter device. The semiconductor device has a semiconductor component, which has a plurality of terminal regions, and a housing element, in which the semiconductor component is accommodated. At least one capacitive element is provided in an integrated manner in the housing element or in the region thereof. The capacitive element in each case has a first electrode region, a second electrode region and a dielectric region essentially provided in between. At least one electrode region of the capacitive element is electrically contact-connected to a terminal region of the semiconductor component. The respective capacitive element is able to suppress high-frequency electrical interference signals between the terminal regions.

When using semiconductor devices, in addition to the desired function, under certain circumstances, interference signals are also generated through the operation of the semiconductor devices. In order to reduce the interference signals generated during operation of the semiconductor devices and the undesired influence of the signals on the operation and function of a circuit configuration, provision is usually made of specific shielding devices and/or filter devices in explicit form in the region of the circuit configuration.

By way of example, it is known, in the case of semiconductor devices, to form filter elements between different terminal elements of the semiconductor device, in the simplest case for example a capacitor provided between two terminal elements, which filter elements can then at least partly suppress interference signals which occur during operation.

The provision of such explicit filter elements results in an additional outlay with regard to mounting.

SUMMARY OF THE INVENTION

It is accordingly an object of the invention to provide a semiconductor device and a converter device that overcome the above-mentioned disadvantages of the prior art devices of this general type, in which high-frequency interference signals that arise can be suppressed in a particularly simple manner. Furthermore, the intention is to specify a converter device in which high-frequency interference signals are suppressed in a particularly simple manner.

With the foregoing and other objects in view there is provided, in accordance with the invention, a semiconductor device. The semiconductor device contains a semiconductor component having a plurality of terminal regions, a housing element accommodating the semiconductor component, and at least one capacitive element disposed in an integrated manner in the housing element or in a region of the housing element. The capacitive element has a first electrode region, a second electrode region and a dielectric region substantially disposed in-between the first electrode region and the second electrode region. At least one of the first and second electrode regions of the capacitive element is electrically contact-connected to one of the terminal regions of the semiconductor component. The capacitive element suppressing high-frequency electrical interference signals between the terminal regions. The capacitive element also functions as an insulator element having an insulation region being the dielectric region and an electrically conductive surface region being the first electrode region disposed on the insulation region. The semiconductor component and the first insulator element are stacked directly one above another in a sandwich-shaped manner.

In known semiconductor devices, in particular in transistor devices or the like, a semiconductor component is provided, in particular a transistor, which has a plurality of terminal regions. Furthermore, in the known semiconductor device, a housing element is formed, in which at least the semiconductor component is accommodated.

The semiconductor device according to the invention, in particular the transistor device, is characterized in that at least one capacitive element or capacitor element is provided in an integrated manner in the housing element or in the region thereof. The capacitive element in each case has a first electrode region, a second electrode region and a dielectric region essentially provided in-between. At least one electrode region of the capacitive element is electrically contact-connected to a terminal region of the semiconductor component in such a way that the respective capacitive element can suppress high-frequency electrical interference signals between terminal regions, in particular essentially by short-circuiting.

It is thus a fundamental aspect of the present invention to form the capacitor in an integrated manner in the housing element of the semiconductor device, or in an integrated manner in the region thereof, which capacitor is connected up to the terminal regions of the underlying semiconductor component in such a way that interference signals, in particular high-frequency interference signals, which are generated through the operation of the semiconductor component can be suppressed, essentially short-circuiting being appropriate in particular in the high-frequency range.

In an advantageous manner, each of the electrode regions of the capacitive element is electrically contact-connected to a respective terminal region of the semiconductor component. What is thereby achieved is that precisely two terminal regions of the semiconductor component are connected in parallel with the corresponding capacitive element, resulting in the suppression precisely of high-frequency interference on account of the impedance—which is low for high frequencies—of the parallel-connected capacitive element through a short circuit. This is particularly important in the case of so-called common-mode interference, e.g. in switched-mode power supplies.

In a particularly preferred embodiment of the semiconductor device according to the invention, the semiconductor component is a transistor, in particular a field-effect transistor, having in each case a source terminal, a drain terminal and a gate terminal as terminal regions.

In this case, it is particularly appropriate for the first electrode region, that is to say the first electrode of the capacitive element, that is to say of the capacitor, to be connected to the drain terminal of the transistor.

In addition, the second electrode region, that is to say the second electrode of the capacitive element, can, moreover, be connected to the source terminal of the transistor.

The last-mentioned measures thus advantageously result in interference suppression with regard to the so-called high-voltage terminals of corresponding transistor devices.

The second electrode terminal may—if appropriate instead of contact-connection to a source region or source terminal—also be configured to be externally connectable, in particular, or be connected to a shielding region, to a ground terminal or the like.

For the concrete configuration of the capacitive element, highly varied measures can be implemented in the region of the housing element.

In accordance with a preferred embodiment of the semiconductor device according to the invention, it is provided that a first insulator element is provided in the housing element. In this case, the first insulator element has an insulation region and thereon an essentially electrically conductive surface region, in particular a metal layer or the like. Preferably, the electrically conductive surface region of the first insulator element is provided as the first electrode region of the capacitive element.

Furthermore, it is provided that the insulation region of the first insulator element is used as the dielectric region of the capacitive element.

It is furthermore advantageous if, for the further configuration of the capacitive element, there is provided as the second electrode region a second, essentially electrically conductive surface region, in particular a second metal layer or the like, on the insulation region of the first insulator element, which is essentially opposite to or opposite in particular the first, essentially electrically conductive surface region.

On the other hand, it is also conceivable for a second insulator element to be provided in the housing element or in the region thereof. The second insulator element has an insulation region and thereon an essentially electrically conductive surface region, in particular a second metal layer or the like, the electrically conductive surface region of the second insulator element being used as the second electrode region of the capacitive element.

In accordance with a further preferred embodiment of the semiconductor device according to the invention, it is provided that the first and second insulator elements are disposed in direct proximity to one another, in particular in contact with one another, in such a way that the essentially electrically conductive surface regions thereof are essentially opposite one another or opposite to one another.

A particularly space-saving configuration for the semiconductor device according to the invention, which configuration is simple with regard to mounting, results if the first insulator element bears with its insulation region or with a part thereof on the second insulator element, in particular on the essentially electrically conductive surface region of the second insulator element or a part thereof.

In addition to the insulation function and the function of forming the second electrode of the capacitive element in the housing element, the second insulator element may additionally be provided as a carrier element that supports the first insulator element and/or the semiconductor component in and/or with the housing element.

In this case, the second insulator element is preferably configured as a lead frame or the like. On the other hand, it is also possible explicitly to provide a carrier element that retains the first insulator element, the second insulator element and/or the semiconductor component in and/or with the housing element.

In this case, too, the explicitly provided carrier element is advantageously a lead frame or the like.

Furthermore, a particularly space-saving and geometrically simple configuration results if the semiconductor component, the first insulator element, the second insulator element and/or the carrier element are configured as plate elements with essentially planar surface regions.

In that case, but also otherwise, it is provided, if appropriate, that the semiconductor component, the first insulator element, the second insulator element and/or the carrier element are disposed stacked directly one above the other in a stack-shaped and/or sandwich-shaped manner, in particular in this order.

Furthermore, it is provided, if appropriate, that the transistor has the source terminal and the gate terminal on its topside and the drain terminal on its underside.

Moreover, it is provided that the transistor bears with its underside, in particular essentially in a flat fashion, on the first electrode region of the capacitive element.

For external contact-connection, it is provided that a plurality of terminal elements are formed in the housing element.

In this case, it is advantageous that each of the terminal regions and, in particular, the gate terminal, the source terminal and the drain terminal are electrically connected to a respective terminal element.

In order to further improve the shielding properties of the capacitor device provided according to the invention, it is provided that the second electrode region of the capacitive element, is electrically connected to a dedicated terminal, in particular effecting external connection. This affords, in particular, the possibility of suppressing common-mode interference or differential-mode interference.

The housing element is advantageously formed from a potting compound or the like, in which the semiconductor component and the capacitive element are embedded.

A further aspect of the present invention consists in the fact that a semiconductor device and, in particular, a transistor device according to the present invention are provided in a converter device, in particular for a power supply device, for a switched-mode power supply and/or the like.

Modern power supplies for a wide variety of applications, e.g. for charging units, plug-in power supply units or PCs, are realized by pulsed switched-mode power supplies. Contemporary power semiconductors enable switching frequencies in the high kHz range, e.g. at 60 kHz or more. This leads on the one hand to a significant reduction in the structural volume of the system, but on the other hand to increased radio-frequency interference. In order to satisfy the required electromagnetic compatibility standards (EMC standards), the interference has to be filtered, if appropriate, with a high outlay hitherto.

The invention gives a description of the fact that the interference suppression outlay can be reduced by a novel housing concept. The latter is based on the possibility of short-circuiting the propagation path of the interference via the capacitive coupling of a carrier or lead frame of a transistor and the heat sink.

This problem has been solved hitherto by additional filter outlay, e.g. an EMI filter and additionally by the use of a shielding pad, which have to provided and mounted outside the respective device.

The shielding pad is a copper sheet that is insulated on both sides with polyamide or polyimide sheet and is coated with thermally conductive wax. The sheet is mounted e.g. between the rear side of the transistor and the heat sink. The pad combines the function of insulation of the transistor from the heat sink and of the filter between drain and source.

The incorporated copper sheet can be connected to the source terminal of the transistor in order thus to short-circuit via the high-pass filter (drain terminal of transistor—heat sink—dielectric of insulation sheet) the propagation path into the power supply line for high-frequency interference currents.

Further capacitors are possible in the equivalent circuit diagram for the propagation path of the interference currents, which capacitors constitute a short circuit within the interference source for high-frequency currents. Propagation of the currents toward the interference sink is thus avoided.

The invention makes it possible to dispense with the shielding pad through a novel housing concept with integrated insulators, such as, for example, silicon or else ceramic disks metallized on the topside. This concept opens up the possibility of insulating the underside drain terminal of the transistor from the lead frame of the housing by insulators that are additionally integrated in the housing.

If two such insulators are integrated one above the other, then the middle metal contact-connection can be connected to the source terminal of the transistor and the same functionality as when using a shielding pad can thus be ensured.

This procedure obviates the shielding pad in the application. The costs for such a pad and additional mounting outlay are thus saved.

Additional costs that would occur would be two insulators in the housing mounting with an additional bonding wire and a possibly more complicated housing (5 terminal legs instead of 3). However, these costs are negligibly low in contrast to the savings for the overall system.

The inventive idea thus resides in a new insulated housing concept with an integrated EMC filter. The invention utilizes the possibility of short-circuiting propagation paths of high-frequency interference currents internally in the housing of the power transistor.

Other features which are considered as characteristic for the invention are set forth in the appended claims.

Although the invention is illustrated and described herein as embodied in a semiconductor device and a converter device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4–7 are diagrammatic, sectional plan views of four other embodiments of the semiconductor device according to the invention.

DESCRIPTION OF THE PREFERRED EMBODIMENTS

Figure 1:
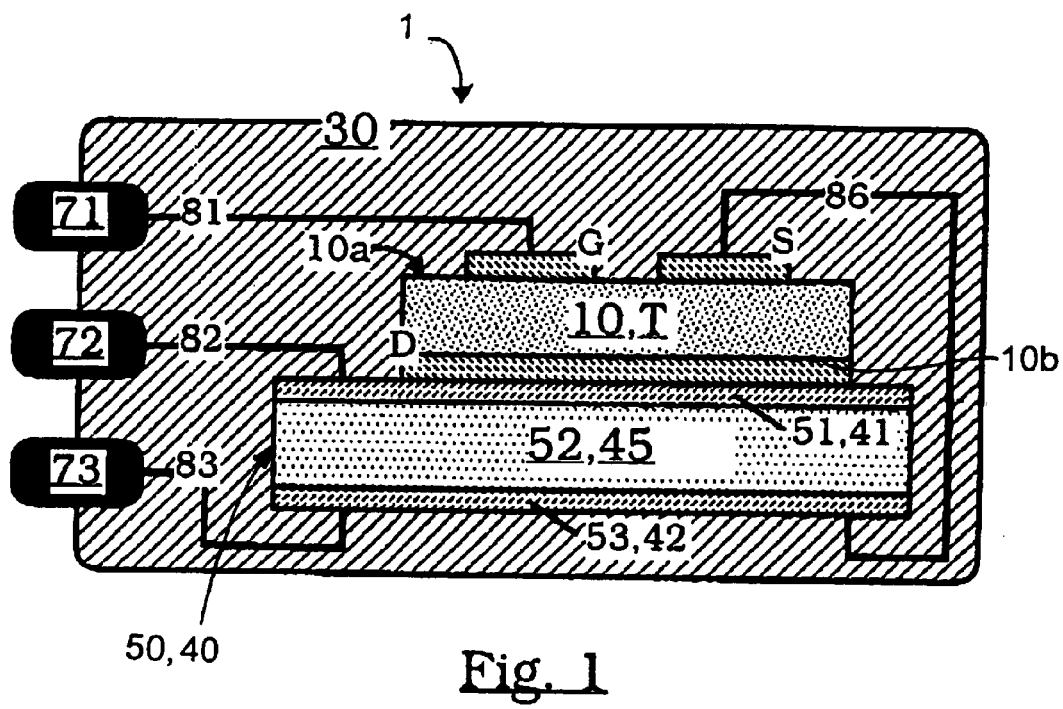
FIGS. 1–3 are diagrammatic, sectional side views of three different exemplary embodiments of a semiconductor device according to the invention.

Hereinafter, the same reference symbols always designate identical or identically acting structural elements without a detailed description being repeated. Referring now to the figures of the drawing in detail and first, particularly, to FIG. 1 thereof, there is shown a first embodiment of a semiconductor device 1 according to the invention in a diagrammatic, sectional side view.

A semiconductor component 10 in the form of a semiconductor chip in the form of a small tile is provided in a housing or housing element 30 formed from a potting compound.

The semiconductor component 10 of FIG. 1 is a transistor T, a gate terminal G and a source terminal S are provided at a surface region 10a of the transistor T. A drain terminal D is formed on an underside 10b of the semiconductor component 10 or the transistor T. The semiconductor component 10 or the transistor T bears with its underside 10b, namely the drain terminal D, on a first insulator element 50, to be precise directly on a first, essentially electrically conductive surface region 51 thereof, which serves in the form of a metal layer as first electrode region 41 or as a first electrode 41 of an integrated capacitive element 40 that is provided according to the invention.

Below the essentially electrically conductive surface region 51, there is formed an actual insulation region 52 adjoined by a second or lower, essentially electrically conductive surface region 53 serving as a second electrode region 42 or as a second electrode 42 of the capacitive element 40 integrated in the housing element 30.

Via lines 81, 82 and 83, the gate terminal G, the drain terminal D and the source terminal S are contact-connected in an external direction to terminal elements 71, 72 and 73, respectively, in the housing 30. In addition, the source terminal S of the transistor T is contact-connected to the second electrode region 42 of the capacitive element 40, to be precise via a line 86.

Consequently, in accordance with the configuration shown in FIG. 1, a capacitance is formed between the electrode regions 41 and 42 with a dielectric region 45 provided in between, which capacitance is connected in parallel between the drain terminal D and the source terminal S and there suppresses high-frequency interference signals, initiated by the transistor T, by a short circuit.

Figure 2:
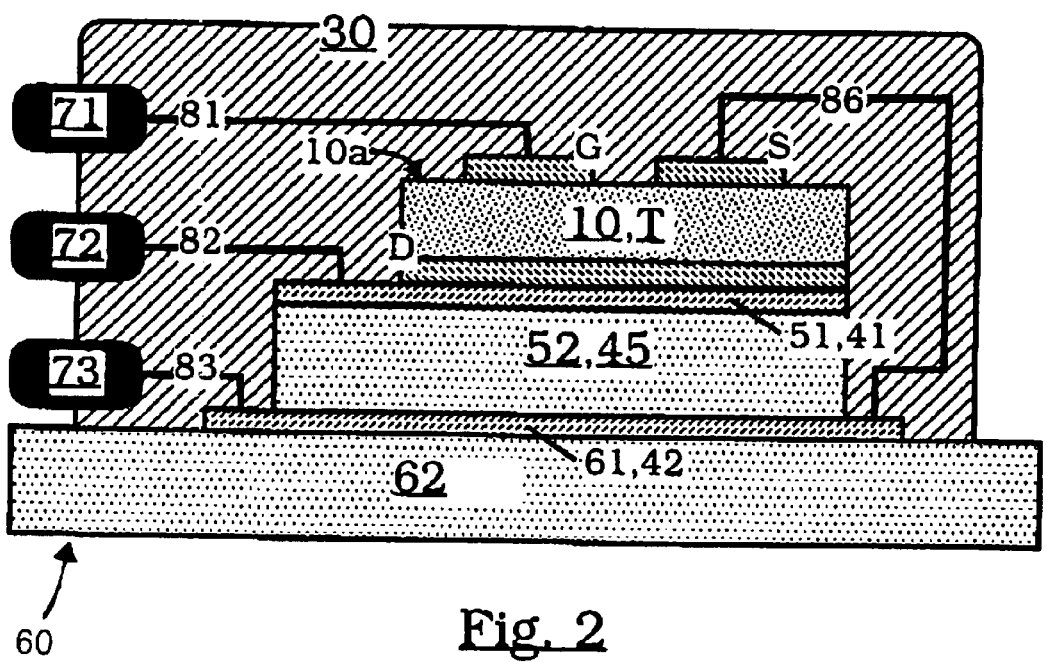

In the case of the embodiment of FIG. 2, in a departure from the embodiment of FIG. 1, a second insulator element 60 is formed, to be precise with an insulation region 62 on which an essentially electrically conductive surface region 61 is formed as the second electrode region 42 of the capacitive element 40.

Essentially the configuration shown in FIG. 1 is applied in a flat fashion on the essentially electrically conductive surface region 61, that is to say the second electrode 42 of the capacitive element 40, the first insulator element 50 having, however, only a first or upper essentially electrically conductive surface region 51 as the first electrode region 41 of the capacitive element 40.

The second insulator element 60 and, in particular, the insulation region 62 thereof serve as a carrier for the first insulator element 50 and the semiconductor component 10 provided thereon.

Otherwise, the conditions are identical to those of the embodiment of FIG. 1.

Figure 3:
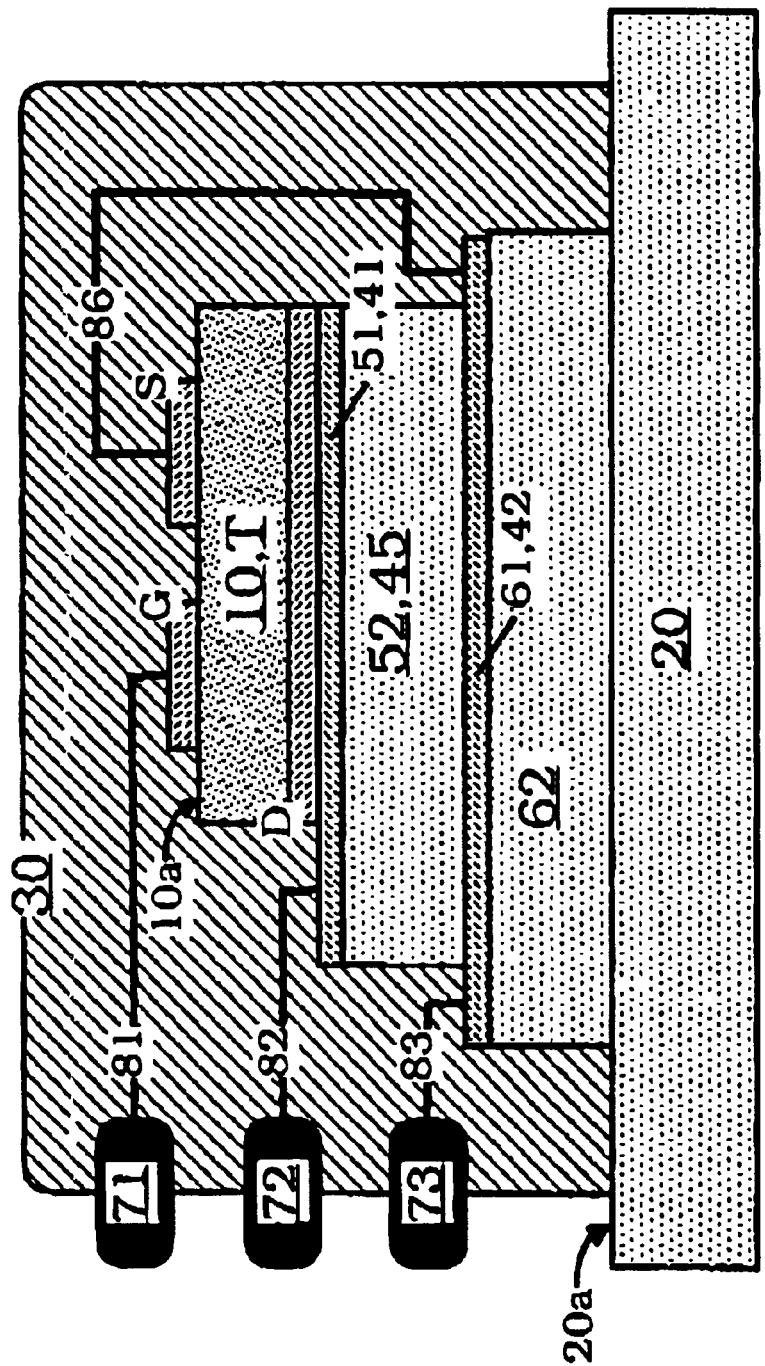

In the case of the embodiment of FIG. 3, an explicit carrier 20 in the form of a metallic lead frame is provided, on whose surface 20a is applied the configuration shown in FIG. 2 in the interior of the housing element 30.

Otherwise, the conditions are identical to those of the embodiments from FIGS. 1 and 2.

FIGS. 4 to 7 illustrate a sequence of configurations according to the invention in diagrammatic, plan views. In this case, the details essentially correspond to those of the embodiments of FIG. 2 or 3, only the deviations therefrom being discussed below.

In the case of the embodiment of FIG. 4, the two insulator elements 50 and 60 are disposed on the lead frame serving as the carrier 20. The three external contacts 71, 72 and 73 are provided in the housing 30, which contacts are connected to the gate terminal G, the drain terminal D and, respectively, the source terminal for external contact-connection. The source terminal S of the transistor T is connected via the bonding wire 86 to the second electrode 42 of the capacitive element 40 as electrically conductive surface region 61 of the second insulator element 60.

Figure 6:
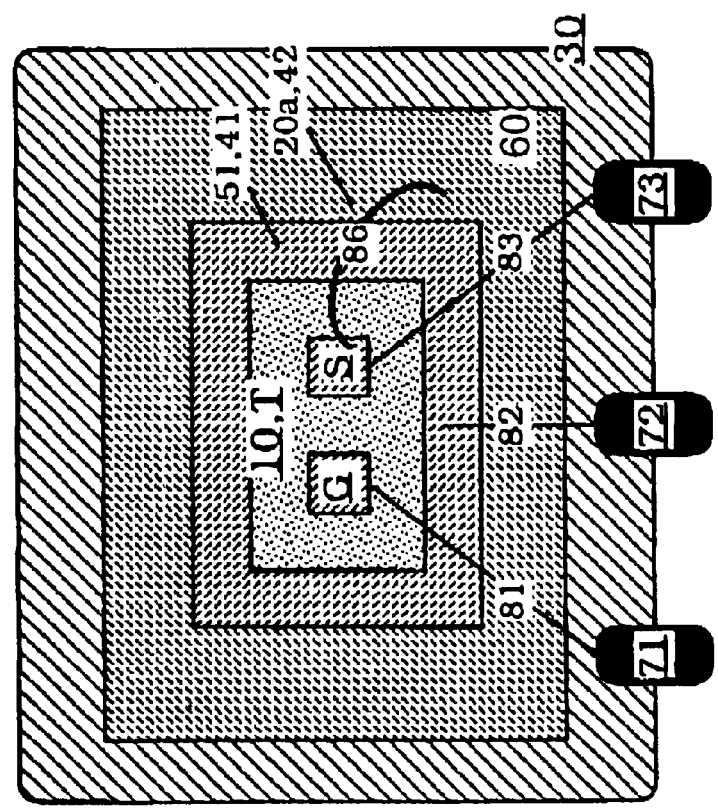

The embodiment of FIG. 6 corresponds to the embodiment of FIG. 4, but now the second insulator element 60, with omission of the lead frame, also serves as the carrier element for the first insulator element 50 and for the semiconductor component 10.

The embodiment of FIG. 5 shows the semiconductor device according to the invention in the form of a so-called five-legged configuration. The configuration essentially corresponds to the configuration of FIG. 4, but the capacitance of the capacitive element 40 is led opposite the drain terminal via a line 85, with omission of the source terminal line 86 from FIG. 4, outward to a shielding terminal 75.

Figure 7:
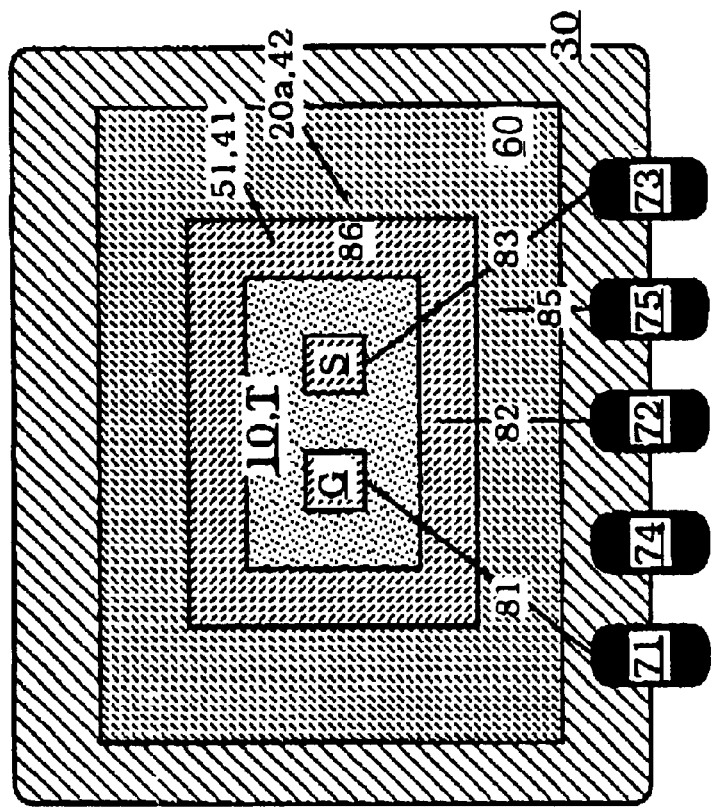

The embodiment of FIG. 7 essentially corresponds to the embodiment of FIG. 5, but the lead frame element has been omitted as the carrier, so that the second insulator element 60 serves as the carrier element and/or as lead frame.

We claim:

1. A semiconductor device, comprising:
a semiconductor component having a plurality of terminal regions;
a housing element accommodating said semiconductor component;
at least one capacitive element disposed in an integrated manner in one of said housing element and in a region of said housing element, said capacitive element having a first electrode region, a second electrode region and a dielectric region substantially disposed in-between said first electrode region and said second electrode region, at least one of said first and second electrode regions of said capacitive element electrically contact-connected to one of said terminal regions of said semiconductor component to form an electrical-contact connection, said capacitive element suppressing high-frequency electrical interference signals between said terminal regions, said capacitive element also functioning as an insulator element having an insulation region being said dielectric region and an electrically conductive surface region being said first electrode region disposed on said insulation region, said semiconductor component and said insulator element disposed stacked directly one above another in a sandwich-shaped manner, said electrical contact-connection being directly between said at least one of said first and second electrode regions of said capacitive element and said one of said terminal regions of said semiconductor component.

2. The semiconductor device according to claim 1, wherein said first electrode region and said second electrode region of said capacitive element are each electrically contact-connected to one of said terminal regions of said semiconductor component.

3. The semiconductor device according to claim 1, wherein said semiconductor component is a transistor having a source terminal, a drain terminal and a gate terminal being said terminal regions.

4. The semiconductor device according to claim 3, wherein said first electrode region is electrically connected to said drain terminal, said first electrode region having a surface mechanically connected to said drain terminal.

5. The semiconductor device according to claim 4, wherein said second electrode region is connected to said source terminal.

6. The semiconductor device according to claim 4, further comprising a further terminal functioning as a ground terminal or a shielding region and said second electrode region is connected to said further terminal.

7. The semiconductor device according to claim 6, further comprising a dedicated terminal element, and said second electrode region of said capacitive element is electrically connected to said dedicated terminal element.

8. The semiconductor device according to claim 3, wherein said transistor has a topside and an underside, said source terminal and said gate terminal disposed on said topside and said drain terminal disposed on said underside.

9. The semiconductor device according to claim 8, wherein said transistor, on said underside, bears in a flat fashion on said first electrode region of said capacitive element.

10. The semiconductor device according to claim 3, further comprising a plurality of terminal elements for external contact-connecting, said terminal elements disposed in said housing element.

11. The semiconductor device according to claim 10, wherein each of said gate terminal, said drain terminal and said source terminal are electrically connected to a respective one of said terminal elements.

12. The semiconductor device according to claim 3, wherein said transistor is a field-effect transistor.

13. The semiconductor device according to claim 1, wherein said electrically conductive surface region is a metallic layer.

14. The semiconductor device according to claim 1, wherein said insulator element has a further electrically conductive surface region disposed on said insulation region opposite to said electrically conductive surface region, said further electrically conductive surface region being said second electrode region of said capacitive element.

15. The semiconductor device according to claim 14, wherein said further electrically conductive surface region is a metallic layer.

16. The semiconductor device according to claim 1, further comprising a further insulator element disposed in one of said housing element and a region of said housing element, said further insulator element having an insulation region and a electrically conductive surface region disposed on said insulation region, said electrically conductive surface region being said second electrode region of said capacitive element.

17. The semiconductor device according to claim 16, wherein said insulator element and said further insulator element are disposed in one of direct proximity to one another and in contact with one another, in such a way that said electrically conductive surface region of said insulator element is disposed opposite said electrically conductive surface region of said further insulator element.

18. The semiconductor device according to claim 17, wherein said insulation region of said insulator element bears on said further insulator element.

19. The semiconductor device according to claim 16, wherein said further insulator element functions as a carrier element supporting said insulator element, said semiconductor component, and said housing element.

20. The semiconductor device according to claim 19, wherein said further insulator element is a lead frame.

21. The semiconductor device according to claim 19, wherein said carrier element supports said insulator element, said further insulator element, said semiconductor component, and said housing element.

22. The semiconductor device according to claim 21, wherein said carrier element is a lead frame.

23. The semiconductor device according to claim 16, wherein said semiconductor device, said insulator element, and said further insulator element are plate shaped elements with planar surface regions.

24. The semiconductor device according to claim 16, wherein said semiconductor component, said insulator element, and said further insulator element are disposed stacked directly one above another in one of a stack-shaped manner and a sandwich-shaped manner.

25. The semiconductor device according to claim 16, wherein said electrically conductive surface region of said further insulator element is a metallic layer.

26. The semiconductor device according to claim 16, wherein said insulation region of said insulator element bears on said electrically conductive surface region of said further insulator element.

27. The semiconductor device according to claim 1, wherein said housing element is formed from a potting compound, said semiconductor component and said capacitive element are embedded in said potting compound.

28. The semiconductor device according to claim 1, wherein said housing element is formed as an integrated unit, said semiconductor component and said capacitive element being disposed in said integrated unit.

29. A converter device for a power supply device for a switched-mode power supply, the converter device comprising:

a semiconductor device, including:
   a semiconductor component having a plurality of terminal regions;
   a housing element accommodating said semiconductor component; and
   at least one capacitive element disposed in an integrated manner in one of said housing element and in a region of said housing element, said capacitive element having a first electrode region, a second electrode region and a dielectric region substantially disposed in-between said first electrode region and said second electrode region,
   at least one of said first and second electrode regions of said capacitive element being electrically contact-connected to one of said terminal regions of said semiconductor component to form an electric-contact connection, said capacitive element suppressing high-frequency electrical interference signals between said terminal regions, said capacitive element also functioning as an insulator element having an insulation region being said dielectric region and an electrically conductive surface region being said first electrode region disposed on said insulation region, said semiconductor component and said first insulator element disposed stacked directly one above another in a sandwich-shaped manner, said electrical contact-connection being directly between said at least one of said first and second electrode regions of said capacitive element and said one of said terminal regions of said semiconductor component.

30. The converter device according to claim 29, wherein said semiconductor component is a transistor having a source terminal, a drain terminal and a gate terminal being said terminal regions.

* * * * *